United States Patent [19]

Tamura et al.

[11] Patent Number: 5,035,782
[45] Date of Patent: Jul. 30, 1991

[54] METHOD FOR THE FORMATION OF MONOMOLECULAR ADSORPTION FILMS OR BUILT-UP FILMS OF MONOMOLECULAR LAYERS USING SILANE COMPOUNDS HAVING AN ACETYLENE OR DIACETYLENE BOND

[75] Inventors: Hideharu Tamura, Tokyo; Kazufumi Ogawa, Osaka, both of Japan

[73] Assignee: Matsushita Electric Industrial Co., Ltd., Japan

[21] Appl. No.: 371,893

[22] Filed: Jun. 27, 1989

[30] Foreign Application Priority Data

Jun. 28, 1988 [JP] Japan ............................ 63-160061
Jul. 6, 1988 [JP] Japan ............................ 63-168205

[51] Int. Cl.$^5$ ............................................. G11B 5/72
[52] U.S. Cl. ............................ 204/157.6; 204/157.64; 204/157.74; 204/157.76; 427/35; 427/36; 427/53.1; 427/54.1; 427/430.1
[58] Field of Search ........... 204/157.6, 157.64, 157.74, 204/157.76, 157.81; 427/35, 36, 53.1, 54.1, 430.1

[56] References Cited

U.S. PATENT DOCUMENTS 4,539,061 9/1985 Sagiv .................................. 430/146
4,673,474 6/1987 Ogawa ........................... 204/157.64
4,751,171 6/1988 Ogawa .............................. 430/299
4,761,316 8/1988 Ogawa .............................. 428/447
4,875,759 10/1989 Ogawa ........................... 350/96.34

FOREIGN PATENT DOCUMENTS 0077577 4/1983 European Pat. Off. .
0095048 11/1983 European Pat. Off. .

Primary Examiner—John F. Niebling
Assistant Examiner—Isabelle R. McAndrews
Attorney, Agent, or Firm—Lowe, Price, LeBlanc & Becker

[57] ABSTRACT

A method for the formation of monomolecular adsorption films of a silane compound having a diacetylene bond is described. The silane compound is chemically adsorbed on a substrate through =SiO— bonds and the resultant film is significantly reduced in number of defects such as pinholes. When the monomolecular film is irradiated with actinic light, the diacetylene bonds are convered into a conjugated diacetylene polymer. Similarly, a built-up film of a desired number of monomolecular layers of a silane compound having an acetylene bond formed on a substrate by chemical adsorption and a corresponding number of monomolecular layers of an aliphatic acid or alcohol having an acetylene bond and alternately deposited on the first-mentioned layer is also provided.

30 Claims, 11 Drawing Sheets

METHOD FOR THE FORMATION OF MONOMOLECULAR ADSORPTION FILMS OR BUILT-UP FILMS OF MONOMOLECULAR LAYERS USING SILANE COMPOUNDS HAVING AN ACETYLENE OR DIACETYLENE BOND

BACKGROUND OF THE INVENTION

1. Field of the Invention

This invention relates to a method for forming a monomolecular adsorption film of a material having diacetylene bonds on a substrate by chemical adsorption and also to a method for forming built-up films of monomolecular layers wherein diacetylene bonds or polydiacetylene bonds are formed in the films. These films have wide utility as a conductive or insulating film in the fields of semiconductive industries.

2. Description of the Prior Art

Attention has been heretofore directed to polydiacetylene materials since they have a very long conjugated polydiacetylene bond in the molecule and exhibit a non-linear optical effect and electric conductivity. These materials are considered to have utility as a functional material. For obtaining these polymers from monomer molecules in the form of crystals which are more functional, studies have been made using the Langmuir-Blodgett technique or vacuum deposition technique.

In general, in order to impart good optical properties to polydiacetylene material, it is necessary that the polymer have a very long polydiacetylene bond. When the Langmuir-Blodgett technique is used, the molecular orientation and density of the monomer can be arbitrarily controlled. This is advantageous in that the reactivity of the monomer by irradiation of actinic light ca be easily controlled. However, when the monomolecular film of the polydiacetylene is formed by the technique, the diacetylene monomer on the water surface in the Langmuir-Blodgett trough is crystallized to form defects in spite of the surface pressure from outside. This leads to the problem that the conjugation length after the polymerization is limited.

On the other hand, the formation of polydiacetylene by the vacuum deposition technique is advantageous in that the film thickness can be appropriately controlled. However, the drawback of the technique is that when heated excessively, the monomer decomposes.

In U.S. Pat. No. 4,673,474, there is mentioned chemical adsorption but this patent does not particularly set out the type of material to be adsorbed and adsorption conditions for such a material.

SUMMARY OF THE INVENTION

It is accordingly an object of the invention to provide a method for forming a monomolecular adsorption film of a silane compound having a diacetylene bond or a diacetylene polymer derived from the silane compound, which film has good orientation of molecules with a reduced number of defects in the film.

It is another object of the invention to provide a method for forming a monomolecular adsorption film of a silane compound having polydiacetylene bonds in a desired pattern.

It is a further object of the invention to provide a method for forming a monomolecular adsorption film of a silane polymer wherein the entire film is formed of the diacetylene polymer.

It is a still further object of the invention to provide a method for forming a built-up film made of two types of monomolecular layers alternately deposited such that one type of layer is made of a silane compound having an acetylene bond and the other type is made of an aliphatic acid or an alcohol having an acetylene bond whereby diacetylene bonds are formed in the built-up film and may be converted into polyacetylene bonds by irradiation with an energy beam.

In accordance with one embodiment of the invention, there is provided a method for the formation of a monomolecular adsorption film which comprises:

providing a substrate having, on the surface, a layer capable of reaction with a silane compound having a diacetylene bond in the molecule; and subjecting the silane compound to chemical adsorption with the layer to form a monomolecular adsorption film of the silane compound on the substrate through the layer wherein the chemical adsorption is carried out either at a temperature not higher than 20° C. whereby the molecules in the adsorption film are oriented in a vertical direction with respect to the substrate or at a temperature between the glass transition temperature and the melting point of the silane compound whereby the molecules in the adsorption film are oriented in an oblique direction with respect to the substrate.

The substrate is preferably made of silicon and the layer is an $SiO_2$ layer.

The orientation of the silane molecules can be controlled either in a direction vertical to the substrate or in a direction oblique to the substrate by heating the film to the level as set forth above. The polymerization of the compound through the diacetylene bonds by application of actinic light or an energy beam capable of conversion of the diacetylene bonds into a conjugated diacetylene polymer depends greatly on this orientation. When the monomolecular adsorption film which has been formed at a temperature of not higher than 20° C. is further heated to a temperature between the glass transition temperature and the melting point, say, about 50° C. in a desired pattern and is subjected to irradiation of an energy beam, the film can be selectively polymerized according to the pattern to form a conjugated diacetylene polymer of the desired pattern. Alternatively, if the monomolecular adsorption film is formed at a temperature between the glass transition temperature and the melting point of silane compound, say 50° C., or is formed at temperatures lower than 20° C. and subsequently heated to the temperature between the glass transition temperature and the melting point and is entirely irradiated with an energy beam, the entire film is polymerized. The heating in a desired pattern is preferably by IR rays.

Fundamentally, the above embodiment makes use of chemical adsorption of silane compounds on a substrate having a layer capable of reaction with the silane compound wherein the molecules of the silane compound self-controllingly undergo chemical bond with the layer to form the monomolecular adsorption film. The substrate used is preferably a silicon substrate which has a naturally occurring oxide layer on the surface although an material may be used provided that it has a surface layer of material capable of chemical adsorption reaction with the starting silane compound. This chemical adsorption is advantageous in that the monomolecular film has little defects.

In accordance with another embodiment of the invention, there is also provided a method for forming a built-up film of monomolecular layers which comprises:

providing a substrate having, on the surface, a layer capable of reaction with a silane compound having an acetylene bond in the molecule:

subjecting a silane compound having an acetylene bond in the molecule to chemical adsorption with the layer to form a monomolecular adsorption film of the silane compound on the substrate through the layer; and applying an aliphatic acid or alcohol having an acetylene bond in the molecule to the adsorption film thereby forming a deposited film of the acid or alcohol through diacetylene bonds with the silane compound.

When the aliphatic acid is used, the acid is chemically bonded to the silane compound by oxidation coupling. Likewise, when the alcohol is used, it is chemically bonded by diindiol oxidation. In both cases, diacetylene bonds are formed between the acid or alcohol and the silane compound. A desired number, e.g. several to several tens, of the monomolecular adsorption films or layers can be formed by repeating the chemical adsorption and the subsequent application of the acid or alcohol. This repetition procedure may be effected after polymerization of diacetylene bonds formed from the silane compound and the acid or alcohol whenever the bonds have been formed. Alternatively, a desired number of monomolecular layers are formed after which the resultant built-up film is subjected to irradiation with an energy beam to polymerize the diacetylene bonds at one time. In the latter case, the when the built-up film is entirely or selectively applied with an energy beam such as far UV rays, adjacent diacetylene bonds are polymerized entirely or in a selected pattern.

BRIEF DESCRIPTION OF THE DRAWINGS

FIGS. 7 and 8 are, respectively, photographs showing pinholes revealed by plating treatment of a chemical adsorption film and the Langmuir-Blodgett film.

DETAILED DESCRIPTION AND EMBODIMENTS OF THE INVENTION

The embodiments of the present invention are described with reference to the accompanying drawings.

FIG. 1 shows a first embodiment of the invention. In FIG. 1(a), there is shown a substrate 1 which is made, for example, silicon. For chemical adsorption of a silane compound having a diacetylene bond, it is necessary that the substrate 1 have a layer 1a capable of chemical adsorption with the silane compound. The silicon used as the substrate 1 is advantageous from the above viewpoint since a SiO$_2$ layer is naturally formed on the substrate in air. In this connection, however, any material may be used as the substrate provided that a layer capable undergoing chemical adsorption with the silane compound is formed on the substrate 1. For instance, metals which are able to naturally form an oxide surface layer when exposed to air are usable and include, for example, not only Si, but also Sn, Al, Ni, Fe, Cr and the like. In addition, metal oxides such as Al$_2$O$_3$, SnO$_2$, Fe$_2$O$_3$ the like are also useful as the substrate material. Of these, Si, Al, Cr and Al$_2$O$_3$ are preferred, of which Si is more preferable.

Figure 1A:
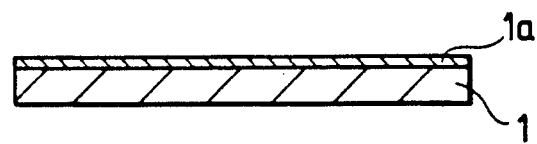
FIGS. 1(a) to 1(i) are illustrative views of the respective steps of a method for forming a monomolecular adsorption film according to one embodiment of the invention.
Figure 1B:
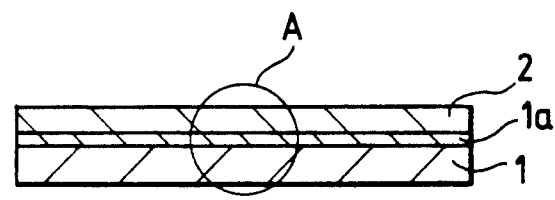

In a subsequent step, a silane compound having a diacetylene bond in the molecule is applied onto the substrate 1 thereby causing chemical adsorption with the layer 1a to form a monomolecular adsorption film 2 on the substrate surface as shown in FIG. 1(b). In practice, the substrate is immersed for the chemical adsorption in a solution of the silane compound in solvent at a concentration of from $2 \times 10^{-3}$ to $5 \times 10^{-2}$ mols/liter. The solvent may be any compound which is able to dissolve the silane compound and includes, for example, hydrocarbons having from 6 to 20 carbon atoms such as n-hexane, n-heptane, n-octane, n-hexadecane and the like, halogenated hydrocarbons such as trichloromethane, carbon tetrachloride, chloroform, trichloroethylene, trichloroethane and the like, and mixtures thereof. The silane compounds having a diacetylene bond are, for example, compounds of the formula (1)

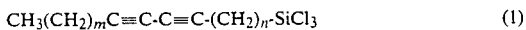

$$CH_3(CH_2)_mC \equiv C-C \equiv C-(CH_2)_n-SiCl_3 \qquad (1)$$

wherein m and n are, respectively, an integer of from 0 to 25, and compounds of the formulae (2) and (3)

$$CH_3(CH_2)_mC \equiv C-C \equiv C-(CH_2)_n-SiHCl_2 \qquad (2)$$

$$CH_3(CH_2)_mC \equiv C-C \equiv C-(CH_2)_n-SiH_2Cl \qquad (3)$$

wherein m and n have, respectively the same meaning as defined above. Of these, the compound of the formula (1) is preferred because the adsorption density is higher. The preparation of these compounds is described, for example, in U.S. Pat. No. 4,761,316, which is incorporated herein by reference.

For instance, the silane compound of the above formula is dissolved in a mixed solvent of 80% of n-hexane, 12% of carbon tetrachloride and 8% of chloroform at a concentration with the above-defined range. When the substrate is immersed in the solution, the bonding of

Figure 1C:
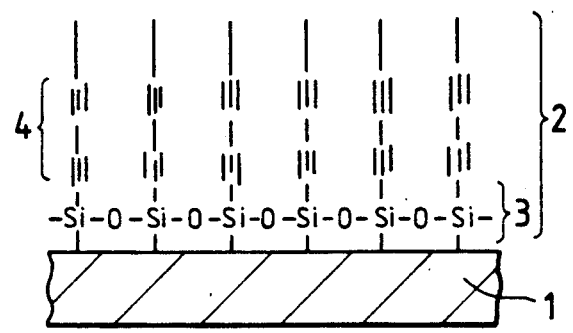

as 3 in FIG. 1(c) is formed on the SiO$_2$ surface. If the solvent is removed, the monomolecular adsorption layer is formed on the substrate by the chemical adsorption. It will be noted that FIG. 1(c) is enlarged view of A of FIG. 1(b).

When the chemical adsorption is carried out at a temperature significantly lower than the glass transition temperature of the silane compound used, the vibration energy of the methylene chains and the end methyl group in the molecule as will be caused by application of heat becomes small. Under these low temperature conditions, the diacetylene bonds 4 are oriented in a direction vertical to the substrate as is particularly shown in FIG. 1(c). For instance, when the silane compound of the formula (1) where m=11 and n=8 is used to carry out the chemical adsorption out at a temperature of from 10° to 20° C. which is significantly lower than the melting point of about 70° C. or the glass transition point of about 40° C. of the silane compound, the vertical orientation is ensured.

Figure 1D:
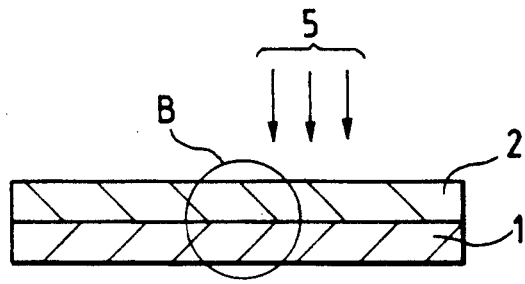
Figure 1E:
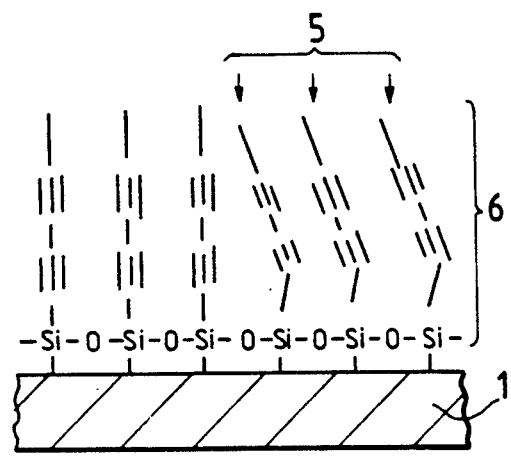
Figure 1F:
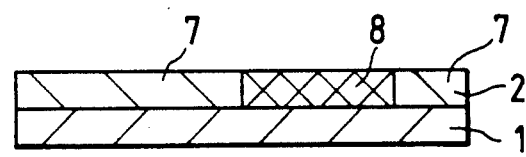

FIG. 1(d) shows selective heating of the monomolecular film 2. When the film 2 is selectively applied with heat as 5 such as from an IR source as shown, the molecules in region 6 of FIG. 1(e) applied with the heat 5 are oriented obliquely. FIG. 1(e) is an enlargement of B of FIG. 1(d). As a result, the monomolecular adsorption film has regions 7 where the molecules are oriented vertically with respect to the substrate and a region 8 where the molecules are obliquely oriented. This is shown in FIG. 1(f). It will be noted that the silane compound having a diacetylene bond is not polymerized by application of heat.

In general, where diacetylene compounds are polymerized by irradiation of an energy beam, the molecules which are to be polymerized are more reactive when the diacetylene bonds are oriented obliquely.

Figure 1G:
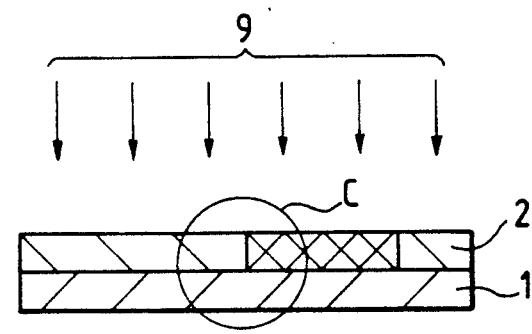
Figure 1H:
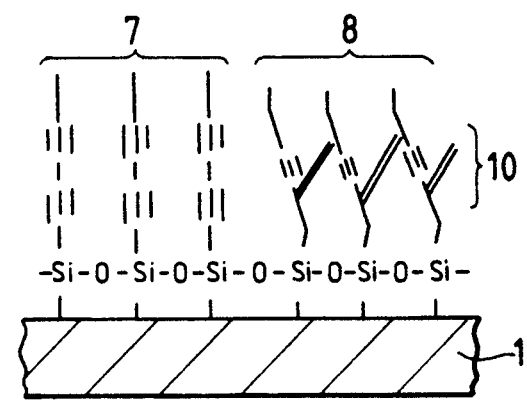
Figure 1I:
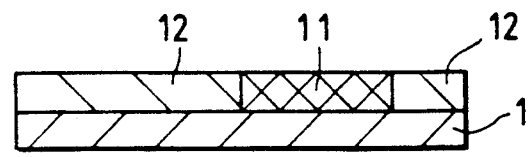

In this condition, when an energy beam 9 is applied over the entire surface of the film 2 as shown in FIG. 1(g), it is possible that the region 7 where the molecules are vertically oriented remains unreacted and the region 8 where the molecules are oriented obliquely undergoes the reaction of the diacetylene bonds to form a polydiacetylene bond 10 in a very high efficiency as shown in FIG. 1(h). It will be noted that FIG. 1(h) is an enlargement of C in FIG. 1(g). The resultant film 2 is shown in FIG. 1(i) wherein it has a pattern with a region 11 having electric conductivity or non-linear optical properties and a region 12 exhibiting no electric conductivity or optical properties. This monomolecular film may have utility in the fields of molecular elements or optics. The energy beam used in the present invention is, for example, a far UV ray having a wavelength of 250±10 nm, at which the diacetylene bonds undergo polymerization, an X-ray or an electron beam.

Reference is now made to FIG. 2 wherein a second embodiment of the invention is illustrated. In the figure, like reference numerals indicate like members or parts as in FIG. 1.

Figure 2A:
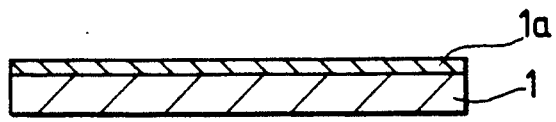
FIGS. 2(a) to 2(f) are illustrative views of the steps of a method for forming a monomolecular adsorption film according to another embodiment of the invention.
Figure 2B:
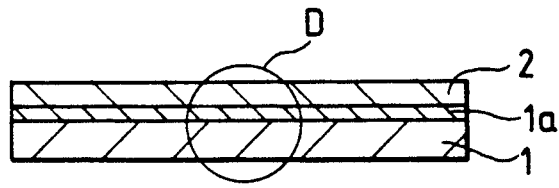
Figure 2C:
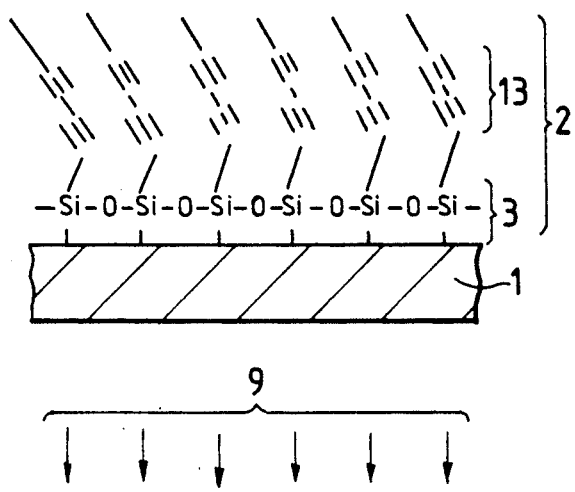

In FIG. 2(a), the substrate 1 having the SiO$_2$ layer 1a is similar to that of FIG. 1(a). The chemical adsorption is carried out in the same manner as in FIG. 1 except that the silane compound is applied at a temperature between the glass transition temperature and the melting point, say, 50° C. thereby forming the monomolecular adsorption film 2 as in FIG. 2(b). FIG. 2(c) is an enlargement of D in FIG. 2(b), from which it will be seen that the diacetylene bonds 13 of the film 2 are oriented obliquely with respect to the substrate since the application temperature is high. More particularly, the adsorption temperature is high at about 50°, which is between the glass transition temperature about 40° C. and the melting point about 70° C. of the afore-indicated silane compound. These temperature characteristics, of course, depend on the type of silane compound. Accordingly, adsorbed molecules can move actively with the aid of the heat energy. This results in the oblique orientation of the diacetylene bonds.

Similar results may be obtained with respect to the orientation when the silane compound is applied at lower temperatures and the resultant film is subsequently heated to a higher temperature as used in the above procedure.

Figure 2D:
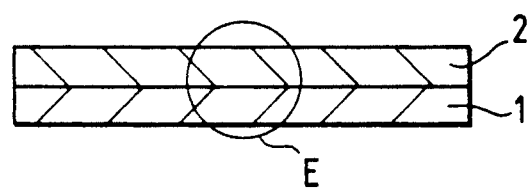
Figure 2E:
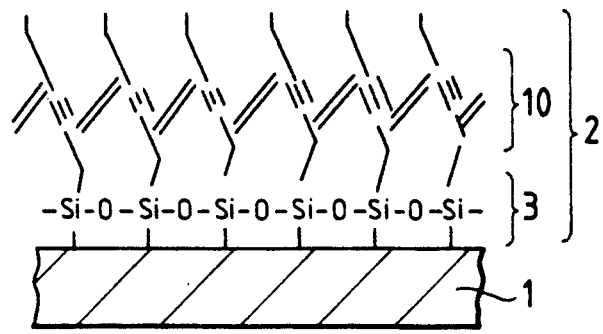
Figure 2F:
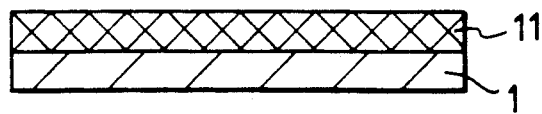

When the monomolecular adsorption film 2 is applied or irradiated with the energy beam 9 such as a far UV ray over the entire surface of the film as shown in FIG. 2(d). The results are shown in FIG. 2(e) which is an enlarged view of E in FIG. 2(d). More particularly, all the molecules in the film 2 are oriented at such an angle as to allow ready reaction of the diacetylene bonds with one another, so that a very long polydiacetylene bond 10 is formed a shown. Since the monomolecular adsorption film 2 is formed along the substrate 1 through the =SiO$_2$ bonds, a monomolecular adsorption film 14 of the polydiacetylene having a very long polydiacetylene bond is formed in this step, which is substantially free of any defect such as a pinhole or void as is shown in FIG. 2(f).

Figure 3:
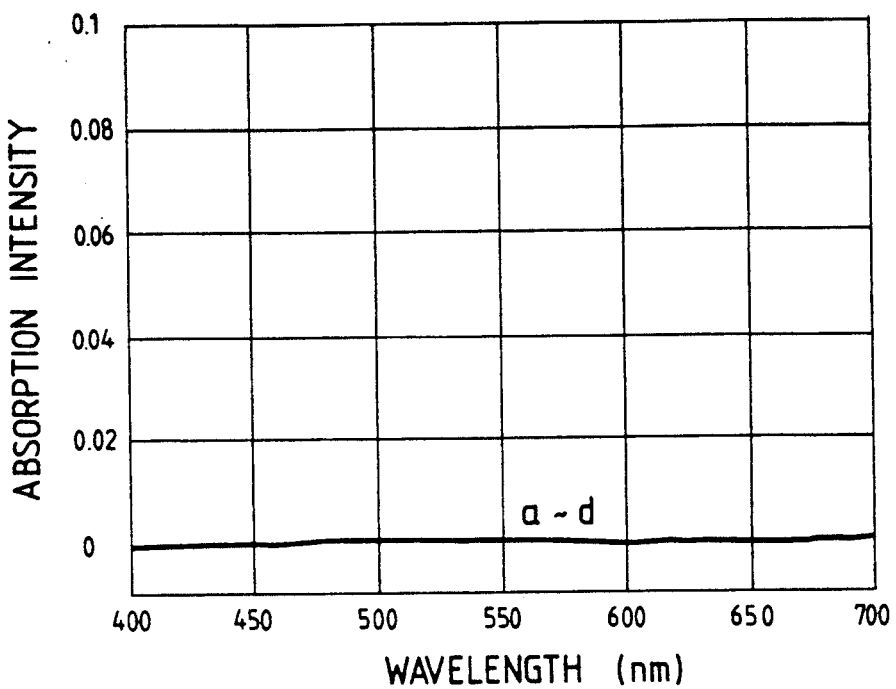
FIGS. 3 and 4 are, respectively, UV absorption spectra for different irradiation times.
Figure 4:
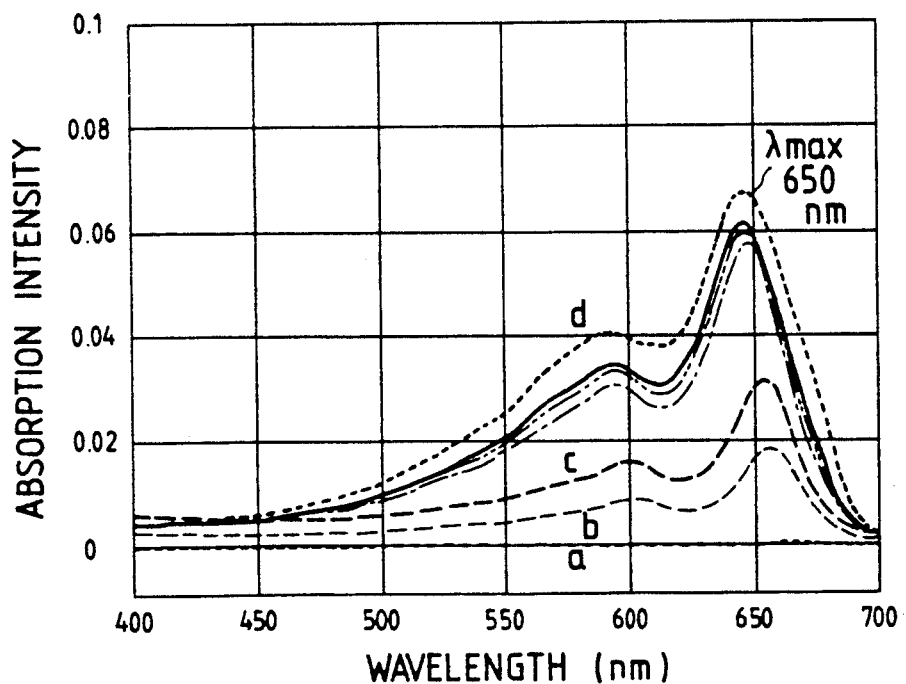

In FIG. 3, there is shown a UV absorption spectrum of a monomolecular absorption film of the silane compound of the formula, $CH_3(CH_2)_{11}C\equiv C\text{-}C\equiv C\text{-}(CH_2)_8\text{-}SiCl_3$ in the region 7 of the first embodiment shown in FIG. 1(h). In the region 7, the film does not undergo any polymerization when a far UV ray with an illuminance of 0.24 mWatt when determined at 365 nm is used for spectrum measurement for different times of 0, 10, 15 and 90 minutes corresponding to the spectra a to d in the figure, respectively. Likewise, FIG. 4 shows a UV absorption spectrum of the region 8 in FIG. 1(h) where the silane compound is polymerized through the diacetylene bonds under the same conditions as indicated above. The irradiation times for the spectra a to d in FIG. 4 are the same as those in FIG. 3.

From the results of FIG. 3, it will be seen that no absorption of polydiacetylene takes place. FIG. 4 reveals that the absorption of the polydiacetylene having $\lambda_{max}$ at 650 is confirmed and becomes greater for a long irradiation time.

A third embodiment of the invention is described with reference to FIG. 5.

In this embodiment, a silane compound having an acetylene bond is chemically adsorbed on a substrate similar to the first and second embodiments and is subsequently deposited with a long chain aliphatic acid or alcohol having an acetylene bond in the molecule to form a deposited film through reaction with the silane compound, thereby forming diacetylene bonds. Because the carboxylic groups of the aliphatic acid or hydroxyl group of the alcohol are arranged on the surface of the deposited film, the silane compound may be further applied so as to form a monomolecular film of the compound. Thus, a desired number of monomolecular films of the silane compound and the monomolecular films of the aliphatic acid or alcohol deposited alternately may be formed on the substrate to form a built-up film. The building-up operation may be effected after polymerization of the diacetylene bonds formed from the silane compound and the acid or alcohol after each formation of the diacetylene bonds. Alternatively, the operation may be performed by repeating the chemical adsorption and the acid or alcohol deposition desired times without polymerization. After completion of the operation, the built-up film is subjected to polymerization at one time. The polymerization is carried out by application of an energy beam as in the first and second embodiments. In general, several to several tens films or layers are built up depending on the purpose of final film.

Figure 5A:
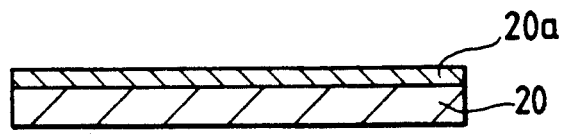
FIGS. 5(a) to 5(i) are illustrative views of the steps of a method for forming a monomolecular adsorption composite film according to a further embodiment of the invention.
Figure 5B:
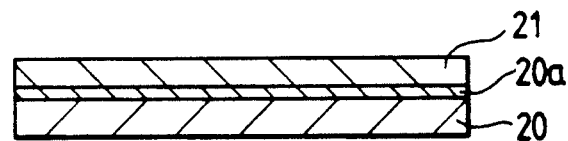

In FIG. 5(a) to 5(b), a silane compound having an acetylene bond in the molecule is applied onto a substrate 20 having, for example, an $SiO_2$ layer 20a to form a monomolecular adsorption film 21 in the same manner as in the first embodiment except that the silane compound is different. In this case, the silane compound has an acetylene bond in the molecule, not the diacetylene bond. Examples of such a silane compound include a compound of the formula (4)

wherein o is an integer of from 1 to 25. Compounds of the formulae (5) and (6)

wherein o has the same meaning as in the formula (4), may also be used. In view of the reactivity, the compound of the formula (4) is preferred.

Figure 5C:
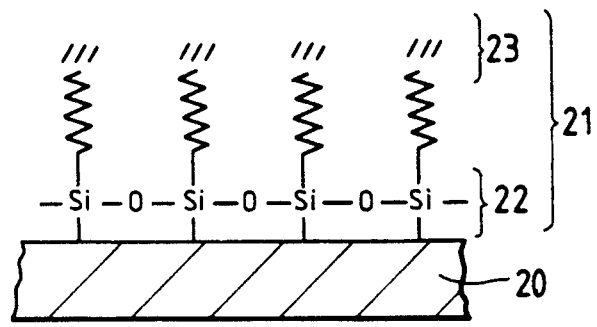

The silane compound is chemically adsorbed as 22 in FIG. 5(c) through the $SiO_2$ layer on the substrate 20. For the chemical adsorption, the substrate 20 is immersed in a solution of the silane compound in a solvent at a concentration of $2 \times 10^{-3}$ to $5 \times 10^{-5}$ mols/liter as used in the first and second embodiments. The acetylene groups 23 in the monomolecular adsorption film 21 are arranged outwardly of the surface of the film as shown in FIG. 5(c).

Figure 5D:
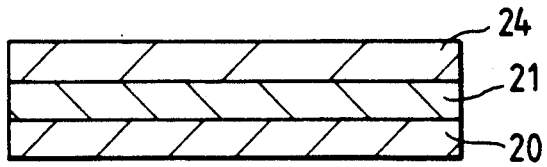
Figure 5E:
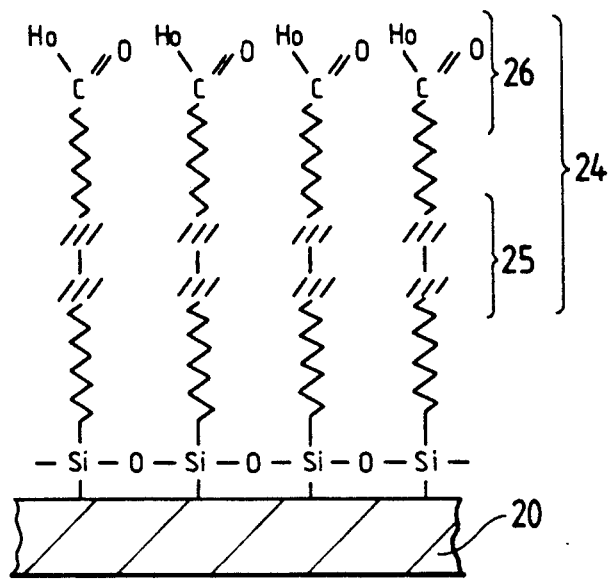

Subsequently, an aliphatic acid having an acetylene group is reacted with the silane compound in the film 21 according to a conventional oxidation coupling technique to form a deposited monomolecular film 24 as shown in FIG. 5(d). Examples of the aliphatic acid include those acids of the formula, $HC{\equiv}C\text{-}(CH_2)_p\text{-}COOH$, wherein p is an integer of from 1 to 25. Preferably, the acid should have a long chain having not less than 8 carbon atoms. For the oxidation coupling with the acetylene bond of the silane compound, the aliphatic acid is used as a solution containing an oxidizing agent, such as cuprous chloride, and TMDA dissolved in a solvent such as acetone, cyclohexanone or the like. The concentration of the acid in the solution is not critical provided that the reaction proceeds satisfactorily. This oxidation coupling should be effected by immersion of the substrate in the solution in coexistence of oxygen in the solution at a temperature of from room temperature to 60° C. As a result, diacetylene bonds 25 are formed at the interface of the monomolecular layers 21 and 24 as shown in FIG. 5(e). The carboxyl groups 26 in the built-up film 24 are arranged outwardly as shown.

Figure 5F:
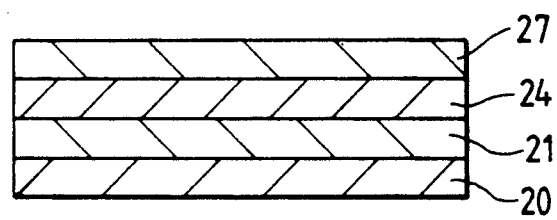
Figure 5G:
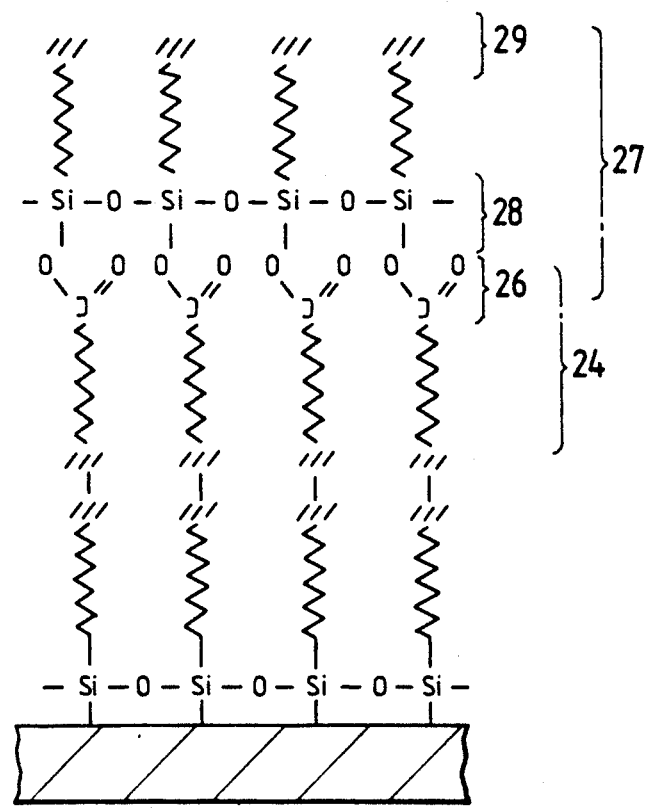

If required, the silane compound used to form the first film may be again chemically adsorbed on the film 24 to form a monomolecular layer 27 as shown in FIG. 5(f). The film 27 reacts with the carboxyl groups in the surface of the film 24 through the =SiO- bonds as shown in FIG. 5(g). Accordingly, the acetylene bonds in the film 27 are in turn arranged outwardly as shown.

Figure 5H:
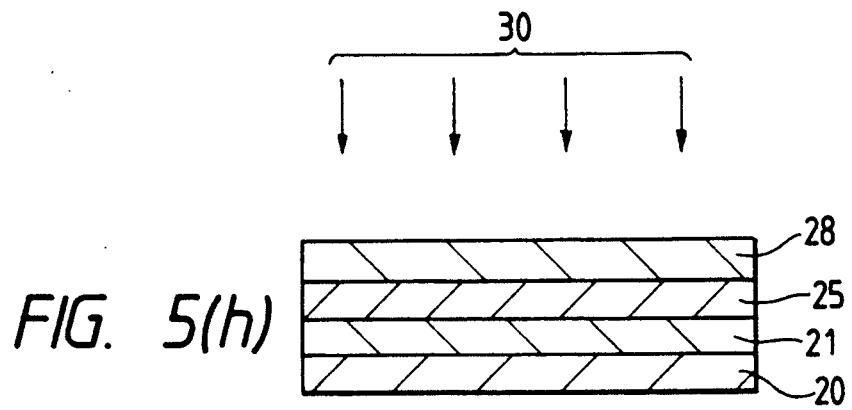
Figure 5I:
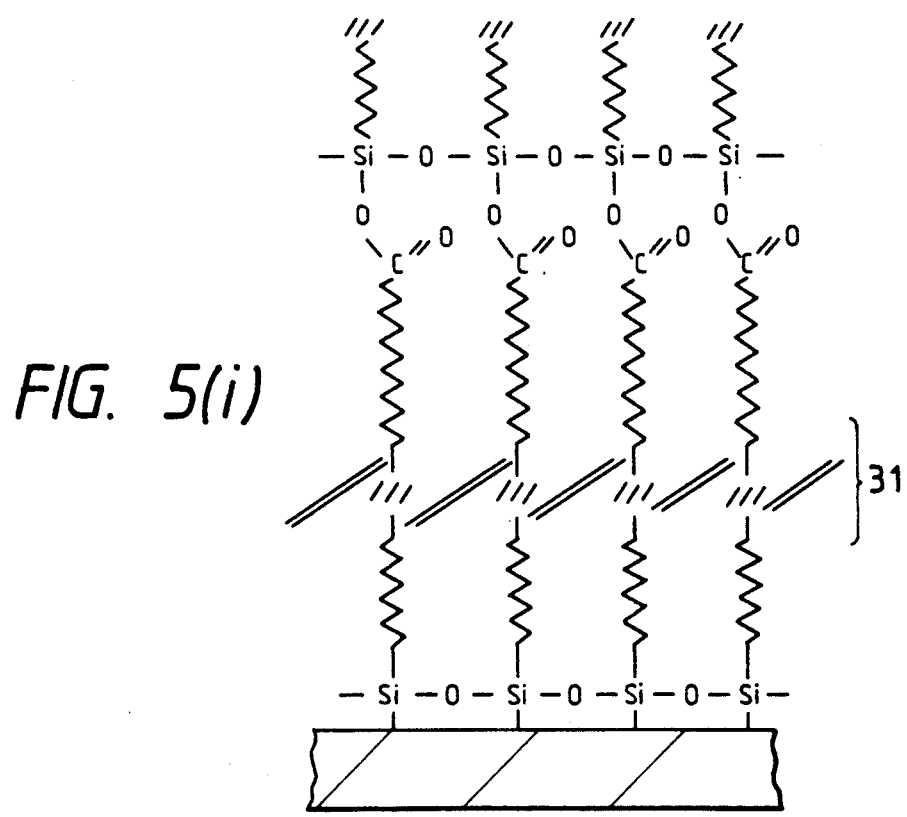

In this state, when an energy beam 30 such as a far UV ray is applied over the entire surface of the deposited films on the substrate 20 as shown in FIG. 5(h), the diacetylene bonds 25 are combined together to form a polydiacetylene bond 31 as shown in FIG. 5(i).

If the steps 5(d) and 5(e) are repeated, prior or after the polymerization, the acid is further deposited on the silane layer to form diacetylene bonds. In this manner, a desired number of monomolecular layers of the silane compound and the acid may be built up. The polymerization may be effected whenever the diacetylene bonds have been formed or after completion of the formation of a desired number of the monomolecular layers.

FIG. 6 shows a fourth embodiment of the invention wherein an alcohol having an acetylene bond is used instead of the aliphatic acid of the third embodiment. In the figure, like reference numerals as in FIG. 5 indicate like members or parts as in FIG. 5.

In the same manner as in FIGS. 5(a) to 5(c), the monomolecular adsorption film 21 is formed on the substrate 20. Subsequently, an alcohol having an acetylene bond in the molecule is deposited on the film 21 by a diindiol oxidation technique known in the art as a monomolecular layer 32 in FIG. 6(a). The alcohol useful for this purpose is of the formula, $HC{\equiv}C\text{-}(CH_2)_q\text{-}OH$ wherein q is an integer of from 1 to 25. Preferably, a long-chain alcohol having not less than 8 carbon atoms is used.

Figure 6A:
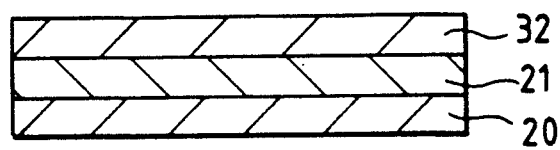
FIGS. 6(a) to 6(f) are illustrative views of the steps of a method for forming a monomolecular adsorption composite film according to a still further embodiment of the invention.
Figure 6B:
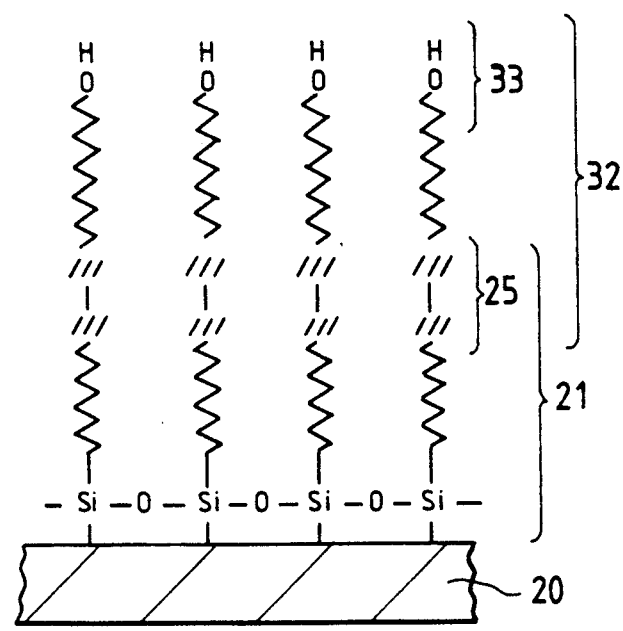

For the deposition of the layer 32 by the diindiol oxidation technique, the alcohol is dissolved in a solvent such as acetone or compounds ordinarily used for this purpose. In the solution, it is necessary to incorporate an oxidizing agent such as chromium (IV) oxide, and a mineral acid such as sulfuric acid, hydrochloric acid or the likes is known in the art. The substrate having the film 21 is immersed in the solution comprising the alcohol at a temperature of not higher than the melting point of the silane compound used, say, at 0° C. By this, diacetylene bonds 25 are formed on the surface of the adsorption film 21 as shown in FIG. 6(b). The hydroxyl groups 33 of the deposited layer 32 are arranged outwardly along the outer surface of the film 32. When the solvent is removed, a built-up film made of the adsorption film 21 and the deposited layer 32 is obtained. The diacetylene bonds 25 may be converted into a polydiacetylene bond by application of a far UV ray.

Figure 6C:
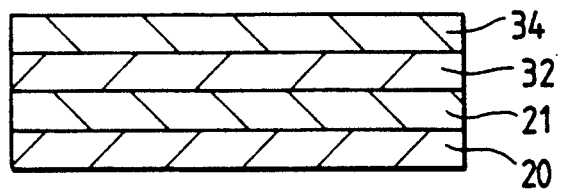
Figure 6D:
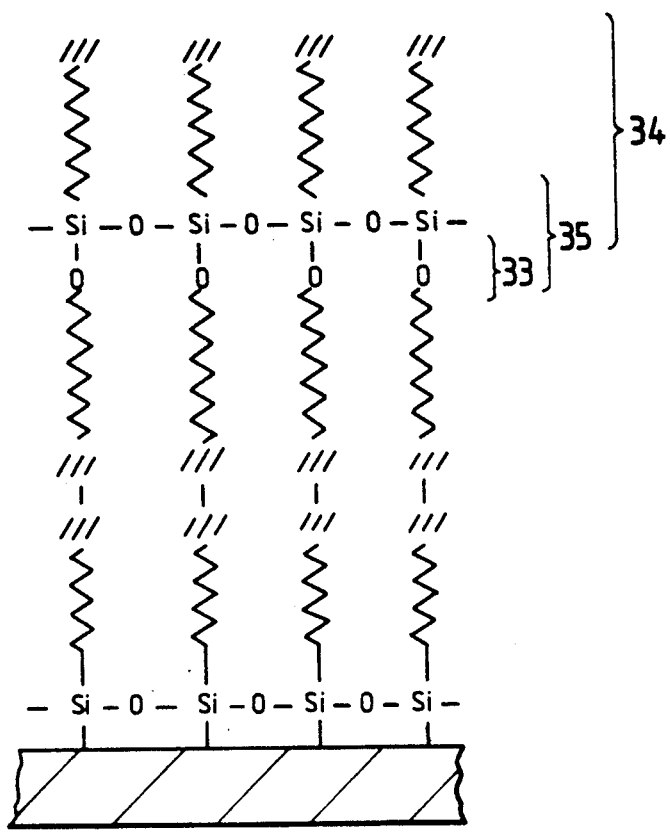
Figure 6E:
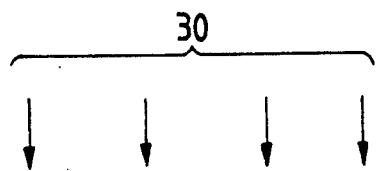
Figure 6E:
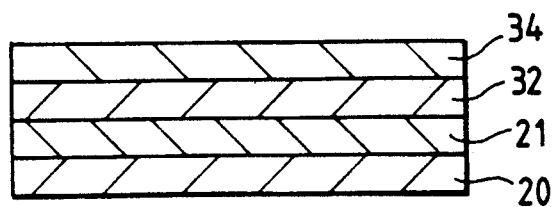
Figure 6F:
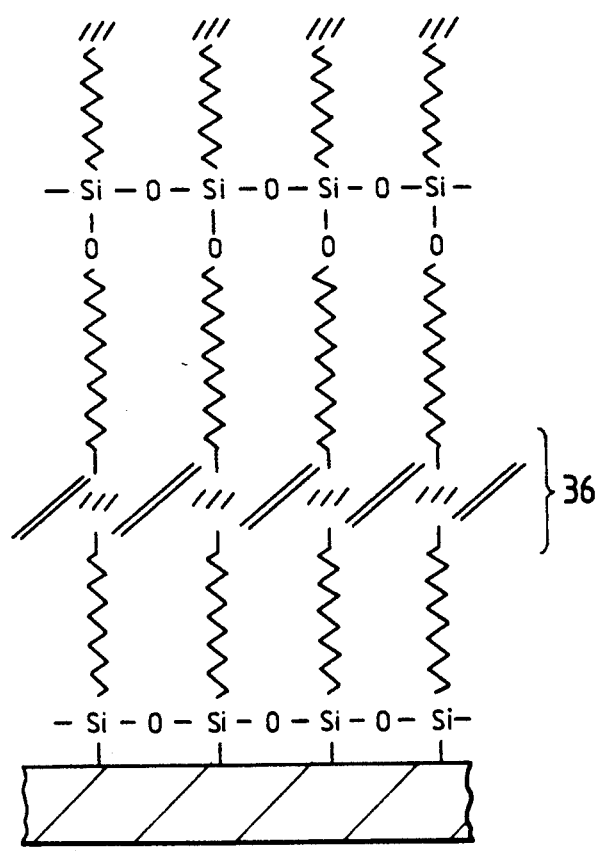

If necessary, the silane compound as used for the formation of the adsorption film 21 is subjected to further reaction with the deposited layer 32 according to the chemical adsorption technique, thereby forming a deposited layer 34 as shown in FIG. 6(c). The silane compound of the deposited layer 34 reacts with the hydroxyl groups 33 to form =SiO- bonds 35. In this condition, when the resultant built-up film is subjected on the entire surface thereof to irradiation of an energy beam 30 such as a far UV ray as shown in FIG. 6(e), the diacetylene bonds 25 are converted into a polydiacetylene bond 36 as shown in FIG. 6(f). Thus, a polydiacetylene-based built-up film can be obtained.

In the third and fourth embodiments of the invention, a desired number of the chemically adsorbed films and a corresponding number of the deposited layers may be built up alternately by repeating the procedures described above, if required, with or without polymerization of diacetylene bonds whenever the bonds have been formed.

In order to confirm pinhole defects of the chemical adsorption film formed according to the present invention and a monomolecular film obtained according to the Langmuir-Blodgett method which is one of typical known methods of forming a monomolecular film, the following experiment is conducted.

The monomolecular adsorption film 21 obtained according to the third embodiment shown in FIG. 5(b) is subjected to plating with copper under conditions of a voltage of 1 V for 3 minutes. This adsorption film is formed using $HC\equiv C\text{-}(CH_2)_{20}\text{-}SiCl_3$.

A monomolecular film of a $HC\equiv C(CH_2)_{20}\text{-}SiO(C_2H_5)_3$ compound is formed on a silicon substrate according to the LB method and subjected to plating in the same manner as described above.

Figures 7, 8:
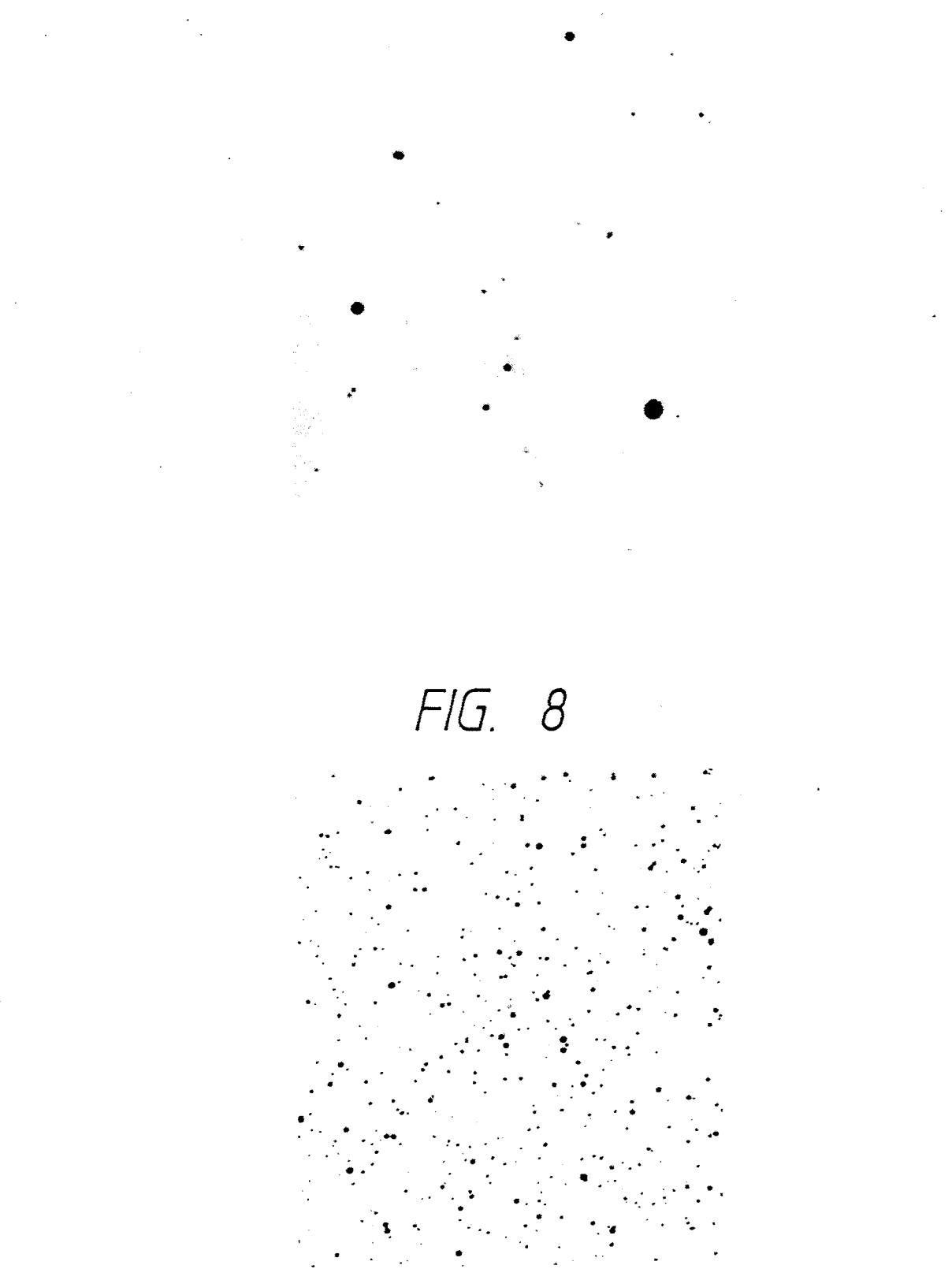

The photographs of the thus plated adsorption film and the plated monomolecular film by the LB method with magnifications of 400 are shown in FIGS. 7 and 8.

If a film having pinholes is subjected to plating treatment, plated particles are formed at the pinholes, making it possible to confirm the presence of the pinholes, if present. The comparison between FIGS. 7 and 8 reveals that for the LB film which has a number of pinholes in the film, the plating current is so dispersed that a number of small plated particles (black spots) are formed. On the contrary, the adsorption film obtained according to the invention has a very reduced number of pinholes, so that the plating current concentrates on such pinholes with large-sized plated particles being formed. From the above, the adsorption film is shown as having a very small number of defects such as pinholes. This is considered for the reason that the adsorption film is formed through self-controlling or active chemical reaction between the substrate surface and the adsorption material as is different from the known techniques such as the LB method.

What is claimed is:

1. A method for the formation of a monomolecular adsorption film which comprises
   providing a substrate having a layer comprising molecules which react with a silane compound having at least one diacetylene bond;
   chemically adsorbing the silane compound to the layer to form a monomolecular adsorption film of the silane compound on the substrate through the layer at a temperature not higher than 20° C.;
   selectively heating a pattern of adsorbed film to a temperature sufficient to cause molecules of the silane compound in the heated portions to become obliquely oriented; and
   irradiating the film with an energy beam to form a conjugated diacetylene polymer only in the selectively heated portions of film.

2. A method according to claim 1; wherein the substrate is made of silicon and the layer is an $SiO_2$ layer.

3. A method according to claim 1, wherein the silane compound has the formula $$CH_3(CH_2)_mC\equiv C\text{-}C\equiv C\text{-}(CH_2)_n\text{-}SiCl_3$$

wherein
m and n are, respectively, an integer of 0 to 25.

4. A method according to claim 1, wherein the chemical adsorption is effected by immersing the substrate in a solution of the silane compound in a solvent at a concentration of from $2\times10^{-3}$ to $5\times10^{-2}$ mole/liter.

5. A method for forming a built-up film of monomolecular layers comprising
   providing a substrate having a layer comprising molecules which react with a silane compound having an acetylene bond;
   chemically adsorbing the silane compound to said layer to form a monomolecular adsorption film characterized by molecules oriented in a direction oblique to the substrate; and
   applying an aliphatic acid having an acetylene bond to the adsorption film by oxidative coupling to thereby form a monomolecular layer of the acid through diacetylene bonds with the silane compound.

6. A method according to claim 5, wherein the substrate is silicon; and the layer is $SiO_2$ layer.

7. A method according to claim 5, wherein the compound has the formula $$HC\equiv C\text{-}(CH_2)_o\text{-}SiCl_3$$

where o is an integer of 1 to 25.

8. A method according to claim 7, wherein the aliphatic acid has the formula $$HC\equiv C\text{-}(CH_2)_p\text{-}COOH,$$

wherein
p is an integer of 1 to 25.

9. A method according to claim 8, wherein p is an integer of 8 or over.

10. A method according to claim 7, wherein said aliphatic acid is deposited by an oxidative coupling method wherein said substrate is immersed in a solution of said acid in the presence of oxygen.

11. A method according to claim 5, further comprising irradiating the diacetylene bonds with an energy beam capable of conversion of the diacetylene bonds into a conjugated diacetylene polymer.

12. A method according to claim 5, further comprising
   chemically adsorbing on the top of the monomolecular layer a silane compound having an acetylene bond through the carboxyl groups of the chemical adsorption through the carboxyl groups of the adsorption film to form a monomolecular adsorption film of the silane compound.

13. A method according to claim 12, further comprising
   irradiating the diacetylene bonds in the films with an energy beam capable of converting the diacetylene bonds into a conjugated diacetylene polymer.

14. A method according to claim 5, wherein the chemical adsorption and the oxidative coupling steps are repeated to form a number of films alternately deposited one on top of another while polymerizing diacetylene bonds whenever the diacetylene bonds are formed in the built-up film.

15. A method according to claim 5, wherein the chemical adsorption and the oxidative coupling steps are repeated to form a number of films alternately deposited one on top of another and the resultant built-up film is irradiated with an energy beam to polymerize diacetylene bonds formed in the built-up film at one time.

16. A method of forming a monomolecular adsorption composite film comprising
   providing a substrate having a layer comprising molecules which react with a silane compound having an acetylene bond;
   chemically adsorbing the silane compound to said layer to form a monomolecular adsorption film characterized by molecules oriented in a direction oblique to the substrate; and applying an alcohol having an acetylene bond to the adsorption film by diindiol oxidation to form a built-up film of the alcohol through diacetylene bonds with the silane compound.

17. A method according to claim 16, wherein
the substrate is silicon; and
the layer is a SiO$_2$ layer.

18. A method according to claim 16, wherein the silane compound has the formula $$HC\equiv C\text{-}(CH_2)_q\text{-}SiCl_3$$

wherein q is an integer of from 1 to 25.

19. A method according to claim 16, wherein the alcohol has the formula $$HC\equiv C\text{-}(CH_2)_q\text{-}OH,$$

wherein q is an integer of from 1 to 25.

20. A method according to claim 16, wherein q is an integer of 8 or over.

21. A method according to claim 16, wherein the alcohol is deposited by diindiol oxidation by immersing the substrate in a solution of the alcohol.

22. A method according to claim 16, further comprising
irradiating the diacetylene bonds with an energy beam capable of converting the diacetylene bonds into a conjugated diacetylene polymer.

23. A method according to claim 16, further comprising
chemically adsorbing a silane compound having an acetylene bond to the hydroxyl groups of the deposited film to form a monomolecular adsorption film of the silane compound on the top of the alcohol film.

24. A method according to claim 23, further comprising irradiating the diacetylene bonds in the films with an energy beam to convert the diacetylene bonds into a conjugated diacetylene polymer.

25. A method according to claim 16, wherein the chemical adsorption and the diindiol oxidation procedures are repeated to form a number of films alternately deposited one on top of another while polymerizing diacetylene bonds whenever the diacetylene bonds are formed in the built-up film.

26. A method according to claim 16, wherein the chemical adsorption and the diindiol oxidation procedures are repeated to form a number of films alternately deposited one on top of another; and
irradiating the thus obtained built-up film with an energy beam to polymerize diacetylene bonds formed in the built-up film at one time.

27. A method for the formation of a monomolecular adsorption film which comprises
providing a substrate having a layer comprising molecules which react with a silane compound having at least one diacetylene bond;
chemically adsorbing the silane compound to the layer to form a monomolecular adsorption film of the silane compound on the substrate through the layer at a temperature between the glass transition temperature and the melting point of the silane compound to cause molecules of the silane compound to become obliquely oriented with respect to the substrate; and
irradiating the adsorbed film with an energy beam to convert the diacetylene bonds into a conjugated diacetylene polymer to form a conjugated diacetylene polymer in the entire film.

28. A method according to claim 27, wherein the substrate is made of silicon and the layer is an SiO$_2$ layer.

29. A method according to claim 28, wherein the silane compound has the formula $$CH_3(CH_2)_mC\equiv C\text{-}C\equiv C\text{-}(CH_2)_n\text{-}SiCl_3$$

wherein
m and n are, respectively, an integer of 0 to 25.

30. A method according to claim 27, wherein the chemical adsorption is effected by immersing the substrate in a solution of the silane compound at a concentration of from $2\times 10^{-3}$ to $5\times 10^{-2}$ mole/liter.

* * * * *